United States Patent
Kwak et al.

(10) Patent No.: US 9,564,234 B2
(45) Date of Patent: Feb. 7, 2017

(54) SEQUENTIALLY ACCESSING MEMORY CELLS IN A MEMORY DEVICE

(71) Applicant: Samsung Electronics Co., Ltd., Suwon-si (KR)

(72) Inventors: DongHun Kwak, Hwaseong-si (KR); Kitae Park, Seongnam-si (KR); JinMan Han, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 27 days.

(21) Appl. No.: 14/186,474

(22) Filed: Feb. 21, 2014

(65) Prior Publication Data

US 2014/0241069 A1 Aug. 28, 2014

(30) Foreign Application Priority Data

Feb. 22, 2013 (KR) ........................ 10-2013-0019329

(51) Int. Cl.
*G11C 16/00* (2006.01)
*G11C 16/26* (2006.01)
*G11C 16/04* (2006.01)
*G11C 16/24* (2006.01)

(52) U.S. Cl.
CPC ........... *G11C 16/26* (2013.01); *G11C 16/0483* (2013.01); *G11C 16/24* (2013.01)

(58) Field of Classification Search
None
See application file for complete search history.

(56) References Cited

U.S. PATENT DOCUMENTS

| | | | |
|---|---|---|---|
| 6,411,546 B1 * | 6/2002 | Estakhri | G06F 3/0604 365/185.11 |
| 7,609,553 B2 | 10/2009 | Hwang | |
| 7,623,386 B2 | 11/2009 | Dong et al. | |
| 7,768,830 B2 | 8/2010 | Shibata et al. | |
| 7,852,676 B2 | 12/2010 | Maejima | |
| 7,898,872 B2 | 3/2011 | Han | |
| 7,965,555 B2 | 6/2011 | Namiki et al. | |
| 8,031,530 B2 | 10/2011 | Joo | |
| 8,107,292 B2 | 1/2012 | Maejima | |
| 8,154,923 B2 | 4/2012 | Li et al. | |
| 2010/0290292 A1 * | 11/2010 | Tanizaki | G11C 16/10 365/185.22 |

(Continued)

*Primary Examiner* — Kretelia Graham
(74) *Attorney, Agent, or Firm* — Muir Patent Law, PLLC

(57) ABSTRACT

Systems and methods of sequentially accessing memory cells in a nonvolatile memory device (NVM) are provided. The NVM has a plurality of strings and a common signal line coupled to the plurality of strings. Each string includes a plurality of memory cells and a selection transistor coupled between the plurality of memory cells and the common signal line. A command that accesses multiple memory cells is received, a voltage is applied to a first selection transistor of a first string to electrically connect the common signal line to the first string, a pulse is applied for a predetermined time period to selection transistors of other strings, and memory cells of the first string are accessed. Advantages such as removal of boosting charges from unselected strings prior to sequentially accessing memory cells from selected strings can improve performance and reliability of NVM-based systems.

20 Claims, 11 Drawing Sheets

(56) References Cited

U.S. PATENT DOCUMENTS

2011/0317489 A1* 12/2011 Kim .................. G11C 16/0483
                                                  365/185.18
2012/0182804 A1    7/2012 Hung et al.

* cited by examiner

SEQUENTIALLY ACCESSING MEMORY CELLS IN A MEMORY DEVICE

CROSS-REFERENCE TO RELATED APPLICATIONS

This application claims priority under 35 U.S.C. §119 to Korean Patent Application No. 10-2013-0019329 filed Feb. 22, 2013, in the Korean Intellectual Property Office, the entire contents of which are hereby incorporated by reference.

BACKGROUND

The inventive disclosure described herein relates to memory systems including nonvolatile memory and methods of accessing the memory.

Semiconductor memory devices may be volatile or nonvolatile. A nonvolatile semiconductor memory device can retain data stored therein even at power-off. Nonvolatile memory devices may be permanent or reprogrammable, depending upon the design and fabrication technology used. Nonvolatile memory devices may be used for a wide variety of applications such as data, program, and microcode storage in the computer, avionics, telecommunications, and consumer electronics industries.

SUMMARY

Embodiments of the inventive concepts are directed to providing methods of accessing a nonvolatile memory device in which a plurality of strings is connected to a common signal line such as a bit line. Each string includes at least one selection transistor, a plurality of memory cells, and at least one ground selection transistor. The selection transistors are controlled by string selection lines. Methods of accessing may comprise receiving an access command such as a read command or a verification operation command. Then if a mode of operation belongs to a sequential access mode such as a sequential read mode a pre-pulse having a predetermined level is applied to unselected string selection lines during a predetermined time. A read pass voltage may be applied to a selected string selection line to read data from memory cells in that string according to the read command.

In various embodiments, methods of sequentially accessing memory cells are provided for a nonvolatile memory device that has a plurality of strings and a common signal line coupled to the plurality of strings. Each string includes a plurality of memory cells and a selection transistor coupled between the plurality of memory cells and the common signal line. Selection transistors couple the respective strings to the common signal line, which may be a shared bit line or a ground line. A command to access multiple memory cells in the nonvolatile memory device is received. A voltage is applied to the selection transistor of a first string to electrically connect the common signal line. A pulse is applied for a predetermined time period to selection transistors of other strings. Memory cells of the first string are then sequentially accessed.

In exemplary embodiments the common signal line is a shared bit line and a command to access multiple memory cells comprises a sequential read operation that accesses multiple memory cells of a first string. A pulse to the selection transistor for an another string is applied for a predetermined time period and completed before providing values of memory cells based on the read operation. Multiple memory cells of the first string are sequentially accessed based on the sequential read operation.

In example embodiments, each of a plurality of strings is formed in a direction perpendicular to a substrate and connected between a bit line and a common source line. Each string may have a string selection transistor at one end and a ground selection transistor at the opposite end.

In example embodiments, access methods comprise determining whether to apply a pulse to unselected string selection lines when the mode of operation belongs to a sequential read mode. Whether to apply the pulse may be decided according to a value corresponding to mode information stored in a register. The mode information may be provided from an external device.

In example embodiments when the mode of operation is a type of sequential access mode, if the access command corresponds to a read operation according to a first read command then a pre-pulse is applied to unselected string selection lines, and if the access command does not correspond to the first read command then a pre-pulse is not applied to the unselected string selection lines.

In example embodiments, applying the pulse to selection transistors of strings may be performed and completed before completion of the access of a first memory cell from a first string, with no pulse applied to the selection transistors of the other strings between the completion of accessing a first memory cell and completion of subsequent sequential access of memory cells of the first string.

In example embodiments, as part of a sequential access, a pulse for a predetermined time period is also applied to ground selection transistors coupled between a common source line and memory cells of strings other than the string being accessed.

Sequentially accessing memory cells of a string may include multiple read commands. A ready/busy signal may be provided having a high level during a first time period starting before a second read command is received and ending after initiation of the second read command. The read/busy signal may then have a low level during a second time period starting after the first time period and ending before completion of a response to the second read command. Voltages applied to word lines of strings not being accessed may be maintained from a time before the first read command is completed until a time after the second read command is received. Voltages applied to word lines of strings not being accessed may be lowered by a predetermined value from a time before the first read command is completed until a time after the second read command is received.

In example embodiments, the method further comprises applying a read pass voltage to at least one ground selection line corresponding to at least one unselected string to remove boosting charges to a common source line.

In example embodiments, a pending section exists when the mode of operation belongs to a sequential read or access mode. A second read command after execution of a sensing operation according to a first read or access command may be received during the pending section. A ready/busy signal may have a high level during a first time when the second command is received and a low level during a second time in the pending section. Voltages applied to the word lines may be maintained in the pending section in some embodiments, and in others may be set to be lower by a predetermined value than that of the sensing period.

Other aspects of embodiments of the inventive concept are directed to providing a memory system comprising at least one nonvolatile memory device. The device includes a shared bit line and a plurality of strings, each string having a plurality of memory cells, a string selection transistor coupled between the memory cells and the shared bit line, and a ground selection transistor. A memory controller is configured to control the at least one nonvolatile memory device. The memory controller is configured to determine whether to issue pre-pulse mode information to the at least one nonvolatile memory device, for example by determining if a read or verification operation belongs to a pre-pulse mode such as a sequential access mode. The at least one nonvolatile memory device is configured to apply a pulse having a predetermined level to unselected string selection lines during a predetermined time interval based on the pre-pulse mode information and to then perform or complete the read or verification operation.

In example embodiments, the at least one nonvolatile memory device further comprises a register configured to store a value corresponding to the pre-pulse mode information. If a read operation belongs to a sequential access mode such a sequential read or verification operation, the memory controller may send pulse mode information with a first command.

In example embodiments, a nonvolatile memory device includes a shared bit line and a plurality of strings each having a plurality of memory cells and a string selection transistor coupled between the plurality of memory cells and the shared bit line. The device is configured to receive a read operation that accesses multiple memory cells of a first string of the plurality of strings, to apply a voltage pulse to string selection transistors of second and third strings of the plurality of strings during a predetermined time interval before providing values of memory cells based on the read operation, and to then complete accesses of multiple memory cells of the first string based on the read operation. The nonvolatile memory device may include a register configured to store a value corresponding to the pulse.

The nonvolatile memory device may include a common signal ground line, with each of the plurality of strings having a ground selection transistor coupled between the common signal ground line and the plurality of memory cells in the string. The strings may be perpendicular to the substrate of the memory device. The device may be further configured to, during a sensing of a value of the first memory cell in the first string, maintain a read pass voltage on a first word line coupled to a first memory cell in each of the first, second and third strings and while maintaining a read voltage on second and third word lines coupled to respective second and third memory cells in each of the first, second and third strings.

BRIEF DESCRIPTION OF THE FIGURES

The above and other aspects and features will become apparent from the following description with reference to the following figures, wherein like reference numerals refer to like parts throughout the various figures unless otherwise specified, and wherein.

DETAILED DESCRIPTION

Figure 1:
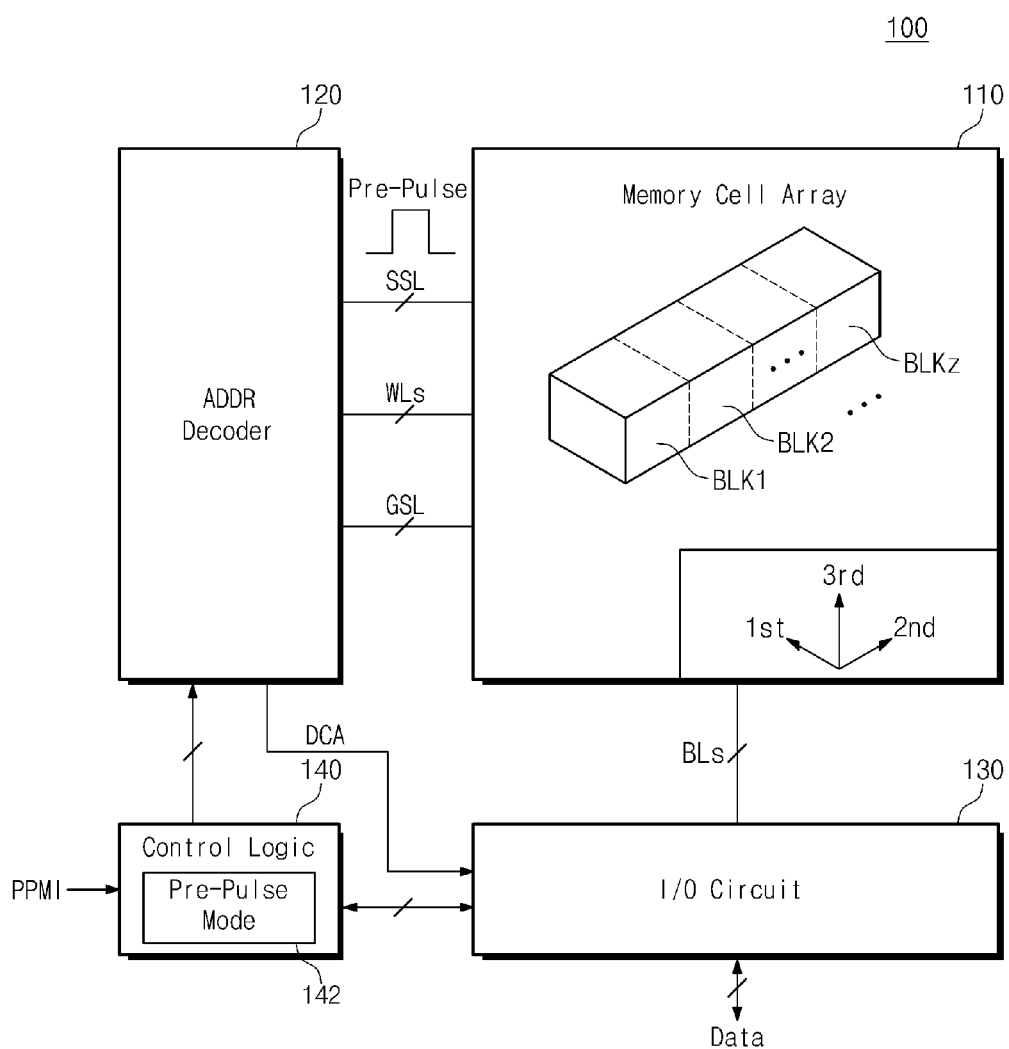
FIG. 1 is a block diagram schematically illustrating an embodiment of a nonvolatile memory device according to aspects of the inventions.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the inventive concepts to those skilled in the art. Accordingly, because known processes, elements, and techniques are known by those of skill in the art, they are not always described with respect to some of the embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below depending on the frame of reference. The device or element may be otherwise oriented (rotated 90 degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The terminology used herein is for the purpose of describing particular embodiments only and is not intended to be limiting of the inventive disclosure and claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device 100 according to an embodiment of the inventions. A nonvolatile memory device 100 may include a memory cell array 110, an address decoder 120, an input/output circuit 130, and control logic 140.

The memory cell array 110 may be connected to the address decoder 120 through word lines WLs, at least one string selection line SSL, and at least one ground selection line GSL. The memory cell array 110 may be connected to the input/output circuit 130 through bit lines BLs. The memory cell array 110 may include a plurality of memory blocks BLK1 to BLKz.

Each of the memory blocks BLK1 to BLKz may include a plurality of strings which are arranged along a first direction, a second direction perpendicular to the first direction, and along a third direction to the plane formed by the first and second directions to have a three-dimensional structure as shown for example in FIG. 2, discussed below. Each string may include at least one string selection transistor, a plurality of memory cells, and at least one ground selection transistor stacked on a substrate. Each memory cell may store at least one data bit.

The address decoder 120 may be connected to the memory cell array 110 through the word lines WLs, the string selection line(s) SSL and the ground selection line(s) GSL. The address decoder 120 may select a word line WL, string selection line SSL and ground selection line GSL using a decoded row address. The address decoder 120 decodes a column address of an input address ADDR and provides the decoded column address DCA may to the input/output circuit 130. In example embodiments, the address decoder 120 may include a row decoder, a column decoder, an address buffer, and so on.

The input/output circuit 130 may is connected to the memory cell array 110 through the bit lines BLs and selects the bit lines using the decoded column address DCA.

The input/output circuit 130 may receive data from an external device (e.g., a memory controller) to store in the memory cell array 110. The input/output circuit 130 may read data from the memory cell array 110 to output it to the external device. Additionally, the input/output circuit 130 may read data from a first area of the memory cell array 110 to store it at a second area of the memory cell array 110. For example, the input/output circuit 130 may be configured to perform a copy-back operation of data within the memory cell array 110.

The control logic 140 may control an overall operation of the nonvolatile memory device 100 including a program operation, a read operation, an erase operation, and so on. The control logic 140 may operate in response to control signals or commands provided from an external device.

The control logic 140 may include a pre-pulse mode register 142 which is configured to determine whether to apply a pulse to the memory cell array 110. The pre-pulse may have a predetermined voltage level and be applied to at least one string selection line SSL during a predetermined time interval to remove boosting charges of an unselected string. The boosting charges of the unselected string may negatively impact performance such as by causing hot carrier injection, so that read disturbance is generated at a read or verification operation on a selected string. Removing the boosting charges from unselected strings improves the performance of an access of a selected string in the memory cell array 110 such as a read or verification operation.

In FIG. 1, there is illustrated an example where a pre-pulse is applied to a string selection line SSL corresponding to an unselected string. However, embodiments of the inventions are not limited thereto. For example, pulses can be applied to a ground selection line corresponding to a ground selection transistor.

The pre-pulse mode register 142 can determine whether to apply a pre-pulse. In example embodiments, the pre-pulse mode register 142 may be configured to apply the pre-pulse according to pre-pulse mode information PPMI. Here, the pre-pulse mode information PPMI may be provided from an external device (e.g., a memory controller). For example, the pre-pulse mode information PPMI may be provided to the control logic 140 from the external device such that the pre-pulse is not applied to improve read performance/speed for a sequential read mode or a burst read mode. In other example embodiments, the pre-pulse mode information PPMI may be generated internally according to driving requirements of the nonvolatile memory device 100.

The nonvolatile memory device 100 may optimize a read operation by deciding whether to apply the pre-pulse according to the pre-pulse mode information PPMI.

Figure 2:
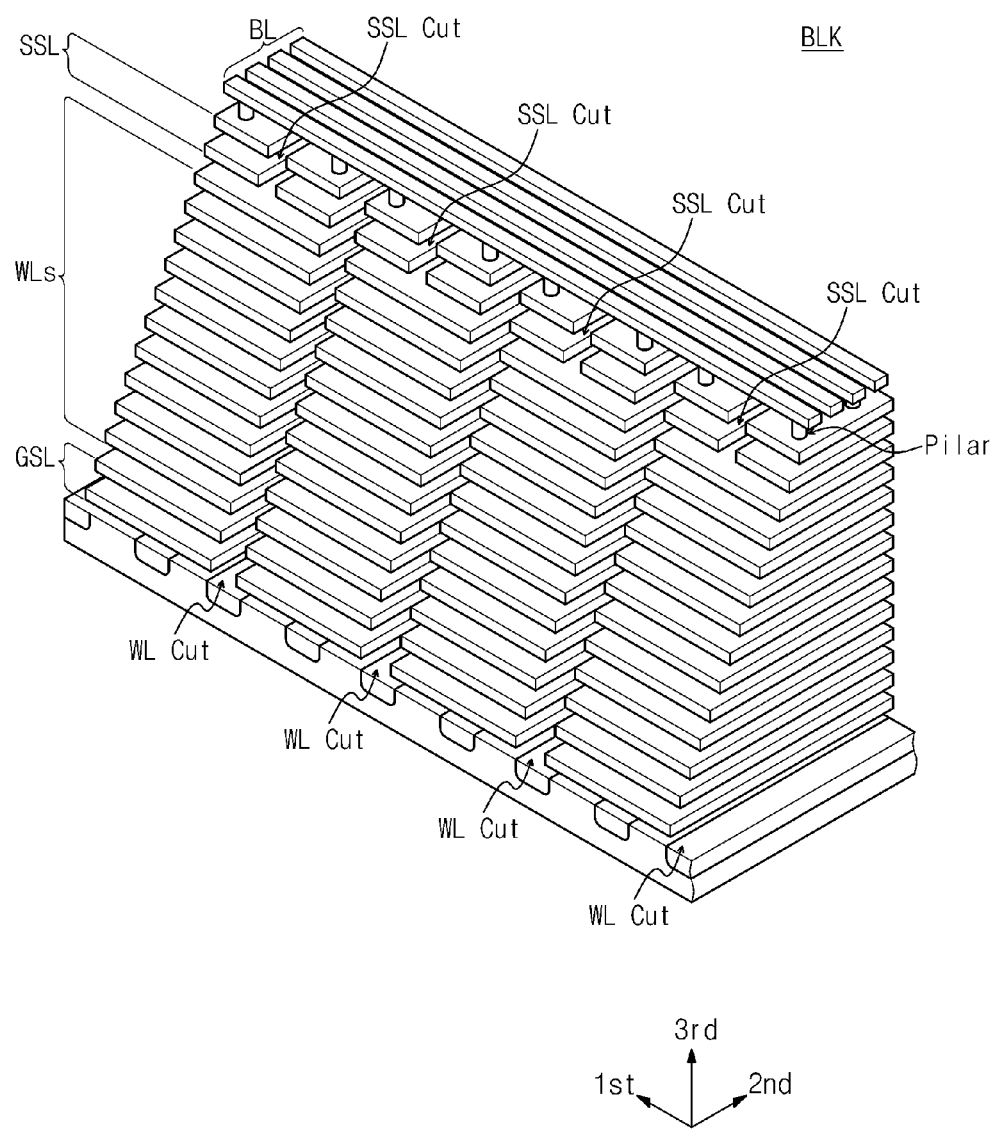
FIG. 2 is a perspective view of an embodiment of a memory block suitable for use with the embodiment of FIG. 1.
Figure 3:
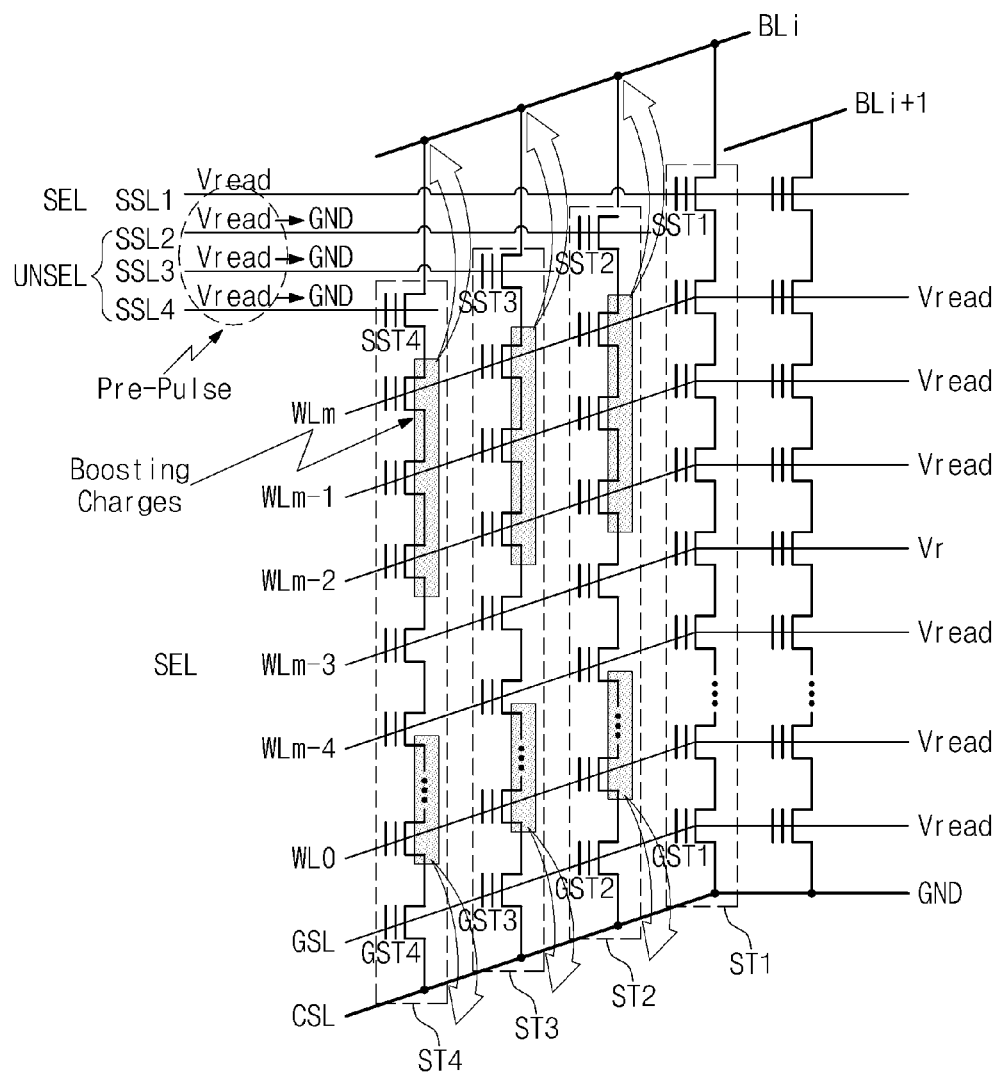
FIG. 3 is a diagram schematically illustrating an embodiment according to aspects of the inventions for boosting charge removal using a pre-pulse during a read operation of a nonvolatile memory device.

FIG. 2 is a perspective view of a memory block BLK of FIG. 1. Referring to the example of FIG. 2, four sub blocks may be formed on a substrate. Each sub block may be formed by stacking at least one ground selection line GSL, a plurality of word lines, and at least one string selection line SSL in a plate shape on the substrate between word line cuts. The string selection line SSL may be separated by string selection line cuts. Although not shown in FIG. 2, each word line cut may include a common source line CSL (as shown in FIG. 3). In example embodiments, the common source lines CSL included in the word line cuts may be interconnected. A string may be formed by making a pillar connected with a bit line that penetrates the at least one string selection line SSL, the word lines, and the at least one ground selection line GSL.

In FIG. 2, a structure between word line cuts may be a sub block. However, implementations of the inventions herein are not limited thereto. For example, a structure between a word line cut and a string selection line cut may be a sub block.

In other variations, a memory block BLK according to the inventions may be implemented to have a merged word line structure where two word lines are merged to one.

FIG. 3 is a diagram schematically illustrating a boosting charge removal technique using a pre-pulse at a read access operation of a nonvolatile memory device 100 according to the inventions. In FIG. 3, there is illustrated a read operation on memory cells corresponding to a word line WLm−3 and a string selection line SSL1. For ease of description, a bit line BLi is shown connected with four strings ST1 to ST4. In this example, the string ST1 is a selected string and the remaining strings ST2 to ST4 are unselected strings. Boosting charges (corresponding to gray portions) of the unselected strings ST2 to ST4 are removed in a bit line direction or a common source line direction before a sensing operation is executed.

Boosting charges may be removed in a bit line direction using a pulse. The pre-pulse illustrated in FIG. 3 can be of the type shown in the examples of FIGS. 4 and 5 discussed below, and is used to apply a predetermined voltage level such as a read pass voltage Vread to string selection lines SSL2, SSL3 and SSL4 during a predetermined time interval. When string selection transistors SST2, SST3 and SST4 of the strings ST2, ST3 and ST4 are turned on, boosting charges of string channels may be discharged to bit line BLi. After boosting charges are removed in the bit line direction, a ground voltage GND may be applied to the string selection lines SSL2, SSL3 and SSL4 to isolate the bit line BLi from the strings ST2, ST3 and ST4. FIG. 3 illustrates relative timing and voltage levels for an exemplary embodiment, and for a particular physical implementation of a memory block, one of ordinary skill can determine without undue experimentation the desired predetermined voltage level (e.g., the read pass voltage Vread) and predetermined time interval for a pulse in order to effectively remove the boosting charges.

Boosting charges may also be removed in a common source line direction by turning on ground selection transistors GST2, GST3 and GST4 of the strings ST2, ST3 and ST4. That is, boosting charges may be discharged to a common source line CSL by similarly applying a predetermined voltage such as the read pass voltage Vread for a predetermined time interval to a ground selection line GSL connected in common to gates of the ground selection transistors GST2, GST3 and GST4.

As described above, after boosting charges are removed, bit lines BLi and BLi+1 may be pre-charged, a read voltage Vr may be applied to a selected word line WLm−3, and the read pass voltage Vread may be applied to the remaining word lines WL0 to WLm−4 and WLm−2 to WLm. Under this bias condition, a sensing operation may be performed to sense on/off states of memory cells corresponding to the selected word line WLm−3 and the selected string selection line SSL1.

Thus, with the read operation of the embodiments of the inventions, it is possible to remove boosting charges of unselected strings (e.g., ST2 to ST4) using a pre-pulse.

Methods of removing boosting charges using the pre-pulse are not limited to a read operation. For example, the inventive methods are applicable to other memory accesses such as a verification operation.

Figure 4:
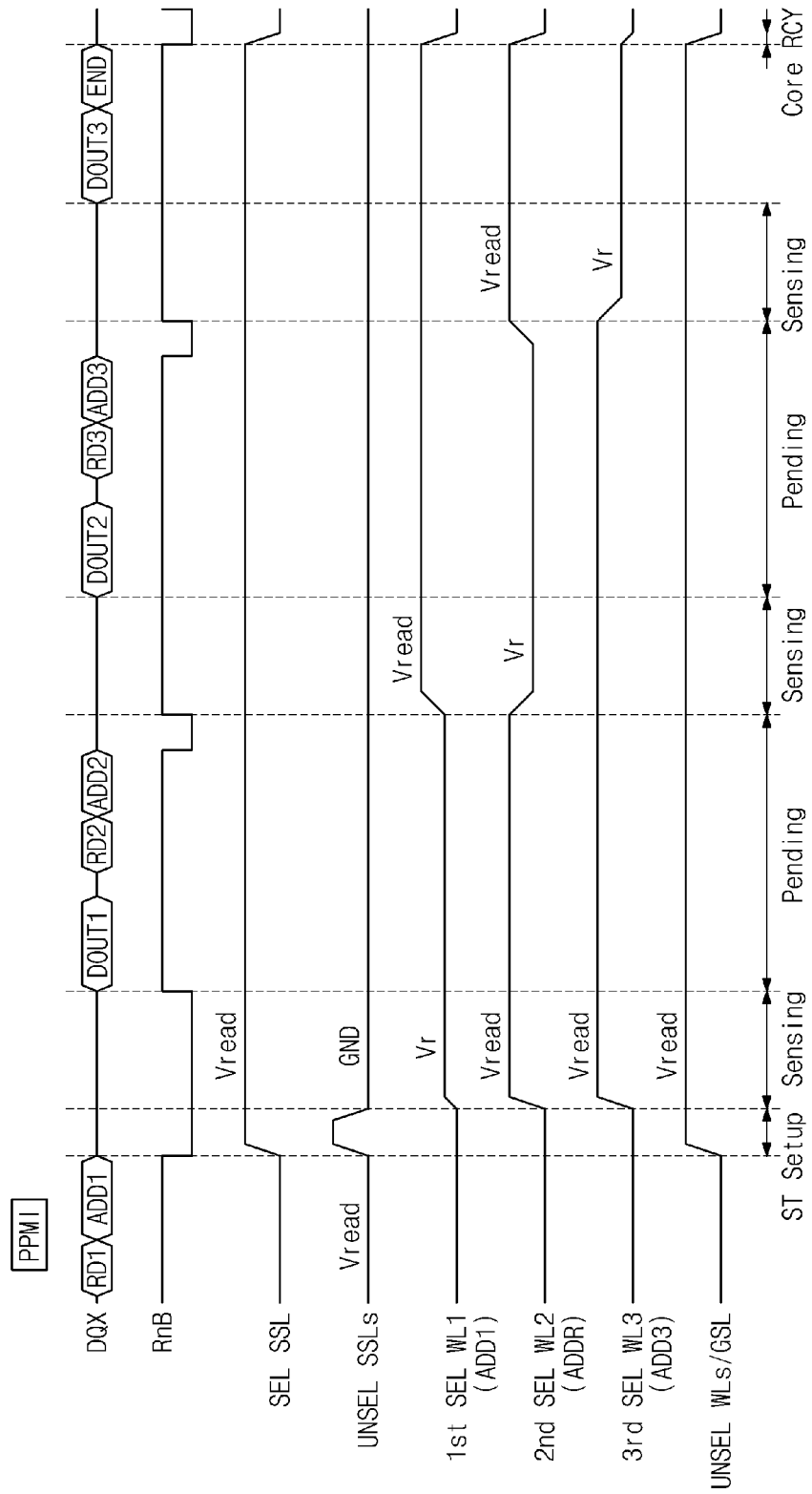
FIG. 4 is a timing diagram schematically illustrating a sequential read operation according to an embodiment of aspects of the inventions.

FIG. 4 is a timing diagram schematically illustrating a read access operation for a sequential read mode of a nonvolatile memory device 100 according to an embodiment of the inventions. Below, a read operation will be more fully described with reference to FIGS. 1 to 4. For ease of description, the illustrative sequential read operation includes first to third read operations sequentially performed. Here, during the first read operation, memory cells corresponding to a first word line WL1 and a first string selection line SSL1 are read out. In the second read operation, memory cells corresponding to a second word line WL2 and a second string selection line SSL2 are read out. In the third read operation, memory cells corresponding to a third word line WL3 and a third string selection line SSL3 are read out.

In the first read operation of this example, a first read command RD1 and a first address ADD1 are received with pre-pulse mode information PPMI directing a sequential read mode. In the string setup section as illustrated in FIG. 4, a voltage pulse is applied to unselected string selection lines SSL2 to SSL4. That is, a predetermined voltage such as the read pass voltage Vread is applied during a predetermined time interval. In example embodiments, the read pass voltage Vread is applied to the selected string selection line SSL1 in the string setup section which illustratively is a portion of the time interval after the first read command and address are received but before the data from the first read command is ready for output (illustratively the pulse is applied within the string setup section).

After the string setup section, the read pass voltage Vread of the selected string selection line SSL1 may be maintained as shown in FIG. 4. Also, a ground voltage GND is applied to the unselected string selection lines SSL2 to SSL4, a read voltage Vr is applied to a first selected word line corresponding to the first address ADD1, and the read pass voltage Vread is applied to the remaining word lines and ground selection line GSL. At this time, a first sensing operation is performed where a variation in voltages of pre-charged bit lines is detected. A ready/busy signal RnB may have a low level while the first sensing operation is performed.

After the first sensing operation, data DOUT1 corresponding to the first read operation may be output, and a second read command RD2 and a second read address ADD2 for the second read operation is received during a pending section. In the pending section, the ready/busy signal RnB may have a high level during a first time interval and a low level during a second time interval as illustrated in FIG. 4. The second read command RD2 is received during a high-level section of the ready/busy signal RnB, and bit lines may be pre-charged during a low-level section of the ready/busy signal RnB. As illustrated in FIG. 4, voltages applied to the string selection lines SSL1 to SSL4, the word lines, and the ground selection line GSL at the first sensing operation may be maintained during the pending section.

Subsequently, the read pass voltage Vread of the selected string selection line SSL1 is maintained. Ground voltage GND is applied to the unselected string selection lines SSL2 to SSL4, the read voltage Vr is applied to a second selected word line corresponding to the second address ADD2, and the read pass voltage Vread is applied to the first word line previously selected. At this time, to read a second memory cell, the read pass voltage Vread of the remaining word lines and the ground selection line GSL are maintained. Under this condition, there is performed a second sensing operation where a variation in voltages of pre-charged bit lines is detected.

Afterwards, data DOUT2 corresponding to the second read operation may be output, and a third read command RD3 and a third read address ADD3 for the third read operation is received during another pending section. As illustrated in FIG. 4, voltages applied to the string selection lines SSL1 to SSL4, the word lines, and the ground selection line GSL at the second sensing operation may be maintained during the pending section.

The read pass voltage Vread of the selected string selection line SSL1 and ground voltage GND applied to the unselected string selection lines SSL2 to SSL4 is maintained, the read voltage Vr is applied to a third selected word line corresponding to the third address ADD3, and the read pass voltage Vread is applied to the second word line previously selected. At this time, the read pass voltage Vread of the remaining word lines and the ground selection line GSL are maintained. Under this condition, to read the third memory cell, there is performed a third sensing operation where a variation in voltages of pre-charged bit lines is detected.

After the third sensing operation is ended, data DOUT3 corresponding to the third read operation may be output. In response to an input of an end command END, a core recovery operation may be performed to discharge voltages the string selection lines SSL1 to SSL4, the word lines, and the ground selection line GSL.

With the sequential read operation according to aspects of the inventions, a pre-pulse is applied for the read operation corresponding to a first read command RD1 but not for read operations respectively corresponding to remaining read commands RD2 and RD3. Because of the removal of the boosting charges, the speed of the sequential read operation may be faster and more reliable as compared with that of a conventional sequential read operation.

As illustrated in FIG. 4, voltages applied to unselected word lines at a previous sensing operation are maintained in a pending section following the previous sensing operation. However, embodiments of the inventions are not limited thereto. For example, as discussed below for FIG. 5, voltages of unselected word lines may be lowered by a predetermined value from the read pass voltage Vread to avoid issues such as generating hot carrier injection (HCI) in the pending section.

Figure 5:
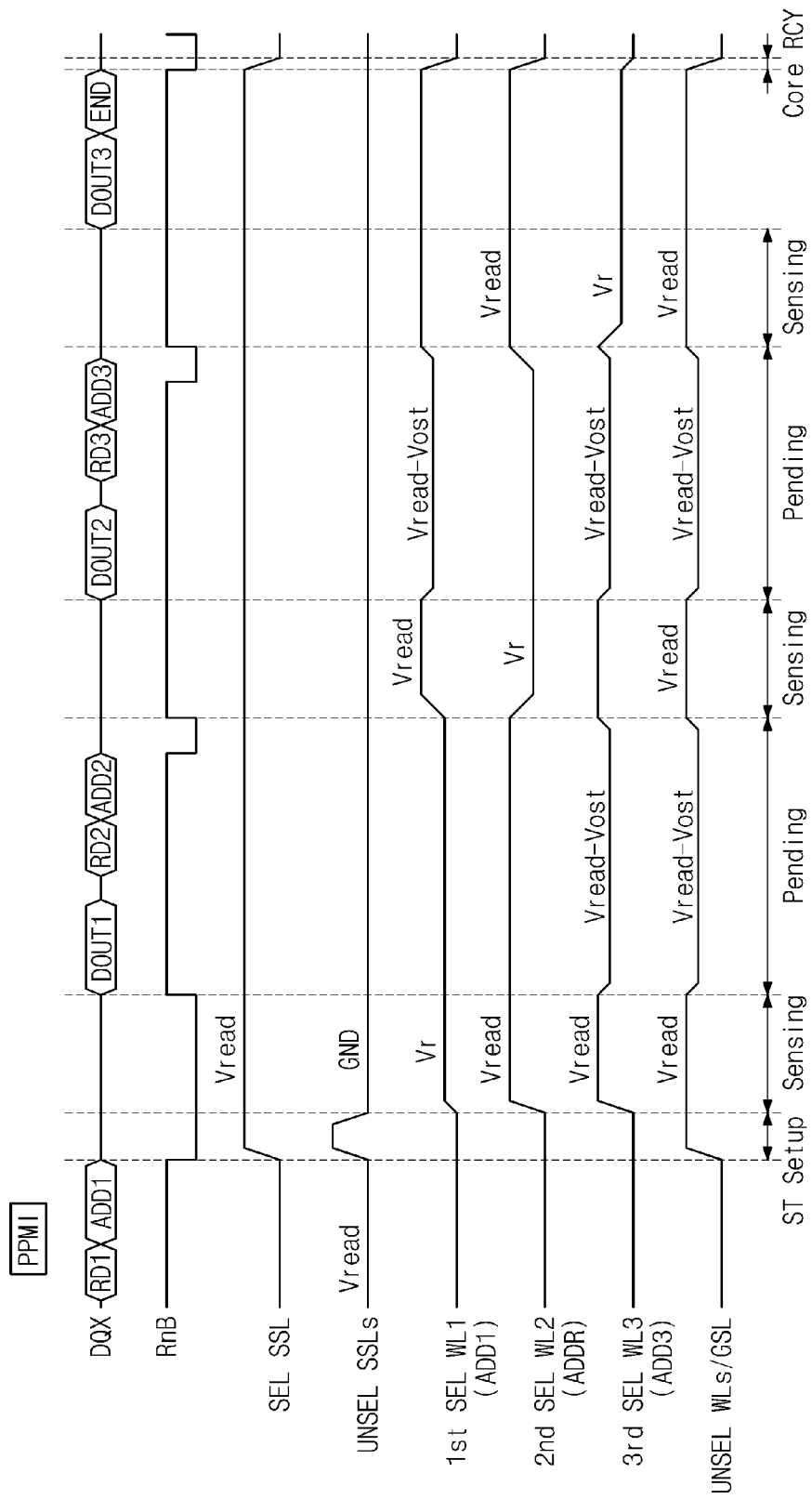
FIG. 5 is a timing diagram schematically illustrating a sequential read operation according to another inventive embodiment.

FIG. 5 is a timing diagram schematically illustrating a read operation of a sequential read mode of a nonvolatile memory device 100 according to another embodiment of the inventive concept. The memory access such as a sequential read as illustrated in FIG. 5 may be different from that described in FIG. 4 in that a hot carrier injection prevention voltage (Vread-Vost) is applied to unselected word lines in a pending section. It is well within the capability of one of ordinary skill to choose an offset voltage Vost according to the physical characteristics of the memory cell without undue experimentation.

Figure 6:
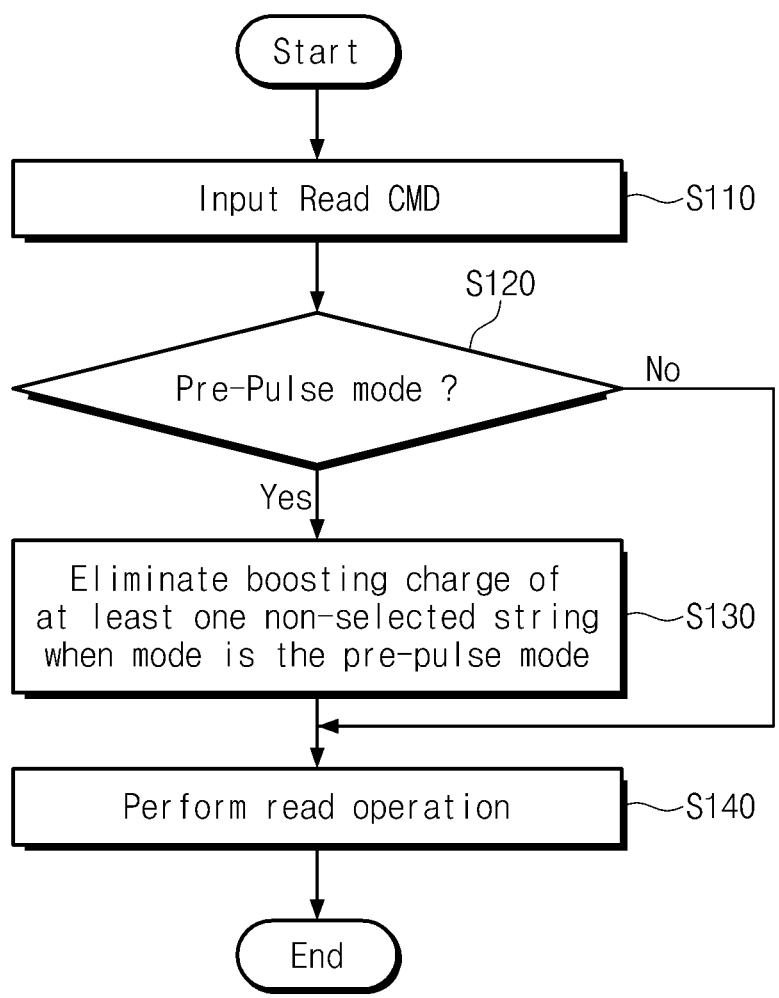
FIG. 6 is a flow chart illustrating an embodiment of a method of reading nonvolatile memory device according to aspects of the inventions.

FIG. 6 is a flow chart illustrating an inventive embodiment of a read method of a nonvolatile memory device 100. With reference to FIGS. 1-5, in step S110, a nonvolatile memory device 100 receives a read command. In step S120, whether a mode of access is a pre-pulse mode is determined based on a value stored in a pre-pulse mode register 142. If the mode of operation is the pre-pulse mode the method proceeds to step S130, otherwise the method proceeds to step S140. In step S130, a pre-pulse is applied to unselected string selection lines (e.g., SSL2 to SSL4 as described above for FIGS. 3-5) such that boosting charges in at least one unselected string are removed. In operation S140, bit lines are pre-charged (e.g., as described above for FIGS. 4-5) and a read access operation is performed to sense data from the memory cells.

With embodiments of the memory cell access method according to the inventions, a pulse is applied to unselected string selection lines in a pre-pulse mode to remove boosting charges as described above.

Figure 7:
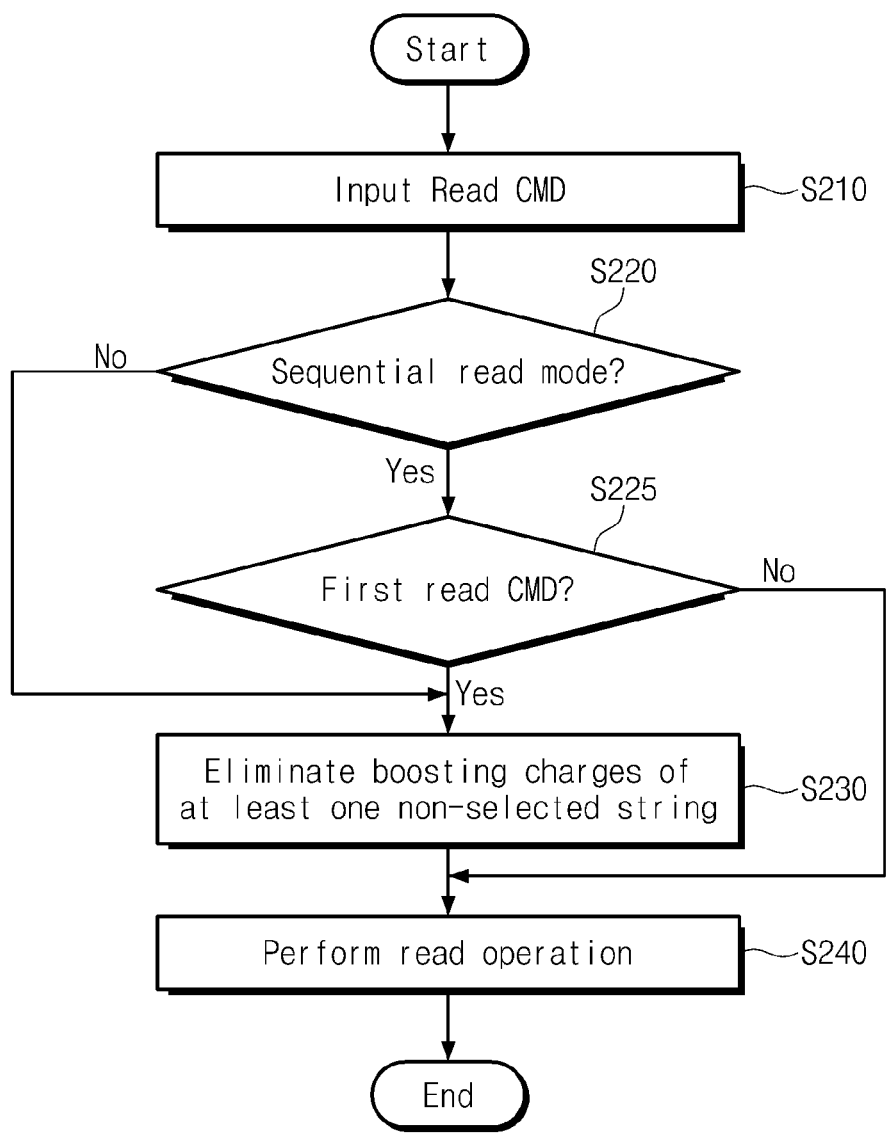
FIG. 7 is a flow chart illustrating another embodiment of a method of reading a nonvolatile memory device according aspects of the inventions.

Again with reference to FIGS. 1 to 5, a read method example of an access method of a nonvolatile memory device 100 according to another embodiment of the inventions will be more fully described with reference to FIGS. 1 to 5 and 7.

In step S210, a nonvolatile memory device 100 receives a read command. In step S220, whether a read operation requested belongs to a sequential read mode is determined. If the read operation requested is of the sequential read mode type, the method proceeds to step S225, otherwise it proceeds to step S230. In step S225 it is determined whether the input read command is a first read command of a sequence of read commands. If so, the may proceeds to step S230, otherwise it proceeds to step S240. In step S230, a pre-pulse is applied to at least one unselected string selection line such that boosting charges in at least one unselected string are removed. In operation S240, a read operation corresponding to the input read command may be performed. Systems and methods according the inventions can improve reliability and performance through application of a pre-pulse to unselected string selection or ground selection lines as part of sequential memory accesses such as sequential reading.

Figure 8:
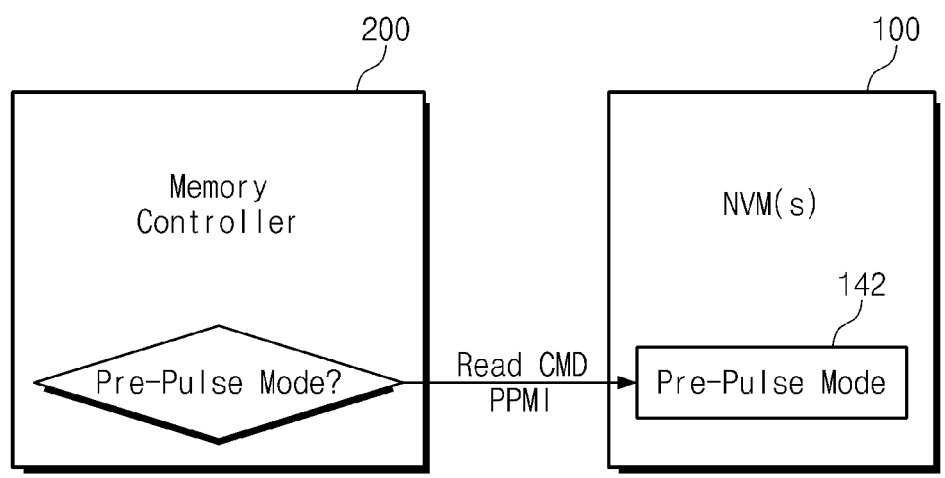
FIG. 8 is a block diagram schematically illustrating a memory system according to an embodiment of the inventions.

FIG. 8 is a block diagram illustrating a memory system 10 according to an embodiment of the inventions. Memory system 10 may include at least one nonvolatile memory device 100 and a memory controller 200 controlling the at least one nonvolatile memory device 100. The memory controller 200 determines whether to perform a pre-pulse mode during operations such as read/verification. The memory controller 200 may send pre-pulse mode information PPMI to the nonvolatile memory device 100 based on the determination result. For example, if the read operation belongs to a sequential read mode, the memory controller 200 may issue the pre-pulse mode information PPMI to the nonvolatile memory device 100 such that a pre-pulse is applied at an input of a first read command and is skipped at an input of the remaining read commands corresponding to the sequential read mode. The nonvolatile memory device 100 may determine whether to apply a pre-pulse at a read/verification operation based on a value stored at the pre-pulse mode register 142.

Systems and methods of accessing a nonvolatile memory device in which a plurality of strings is connected to a bit line may comprise determining whether a mode of operation belongs to a pre-pulse mode. If the mode of operation belongs to a pre-pulse mode, boosting charges of at least one unselected string of the plurality of strings are removed. Data from memory cells in a selected string of the plurality of strings is then read.

A memory system according to an embodiment of the inventive concept may include at least one nonvolatile memory device and a memory controller. The nonvolatile memory device may include memory blocks each having a plurality of strings connected between a bit line and a common source line to be formed in a direction perpendicular to a substrate. The nonvolatile memory device may be configured to remove boosting charges of unselected strings of the plurality of strings at a read or verification operation according to pre-pulse mode information. The memory controller may control the nonvolatile memory device. The memory controller may determine whether the read or verification operation belongs to a pre-pulse mode and issue the pre-pulse mode information to the nonvolatile memory device based on the determination result.

Figure 9:
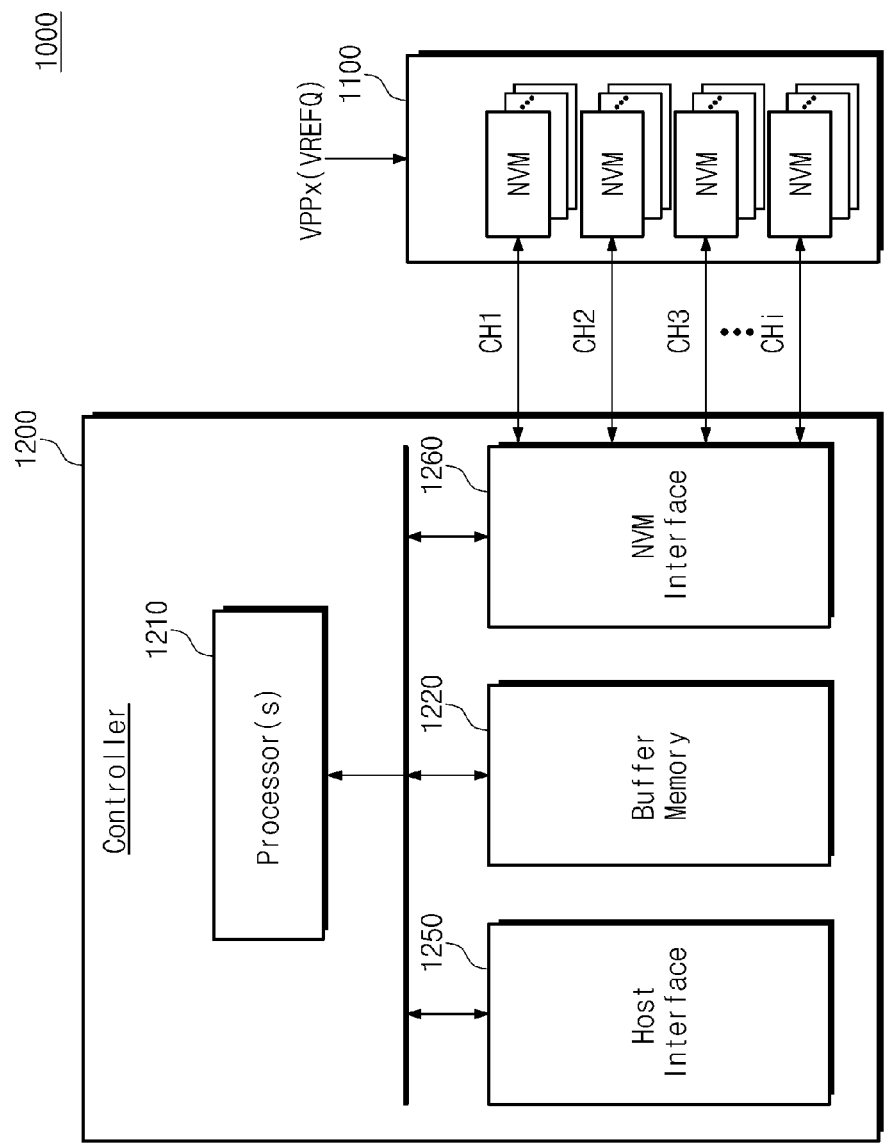
FIG. 9 is a block diagram illustrating a solid state drive according to an embodiment of the inventions.

Aspects of the inventions apply to solid state drives. FIG. 9 is a block diagram schematically illustrating a solid state drive according to an embodiment of the inventive concept. Referring to FIG. 9, a solid state drive (hereinafter, referred to as SSD) 1000 may include a plurality of flash memory devices 1100 and an SSD controller 1200. The flash memory devices 1100 may be supplied with an external high voltage VPPx. Each of the flash memory devices 1100 may be implemented in conjunction with the controller 1200 to perform a pre-pulse applying method of the inventive concept described with reference to FIGS. 1 to 8. The SSD controller 1200 may be connected to the flash memory devices 1100 through a plurality of channels CH1 to CHi (i being an integer of 2 or more). The SSD controller 1200 may include at least one processor 1210, a buffer memory 1220, a host interface 1250, and a flash interface 1260.

The SSD 1000 of the inventive concept may be optimally driven and provide improvements in performance and reliability by controlling a pre-pulse as part of program and read operations.

Figure 10:
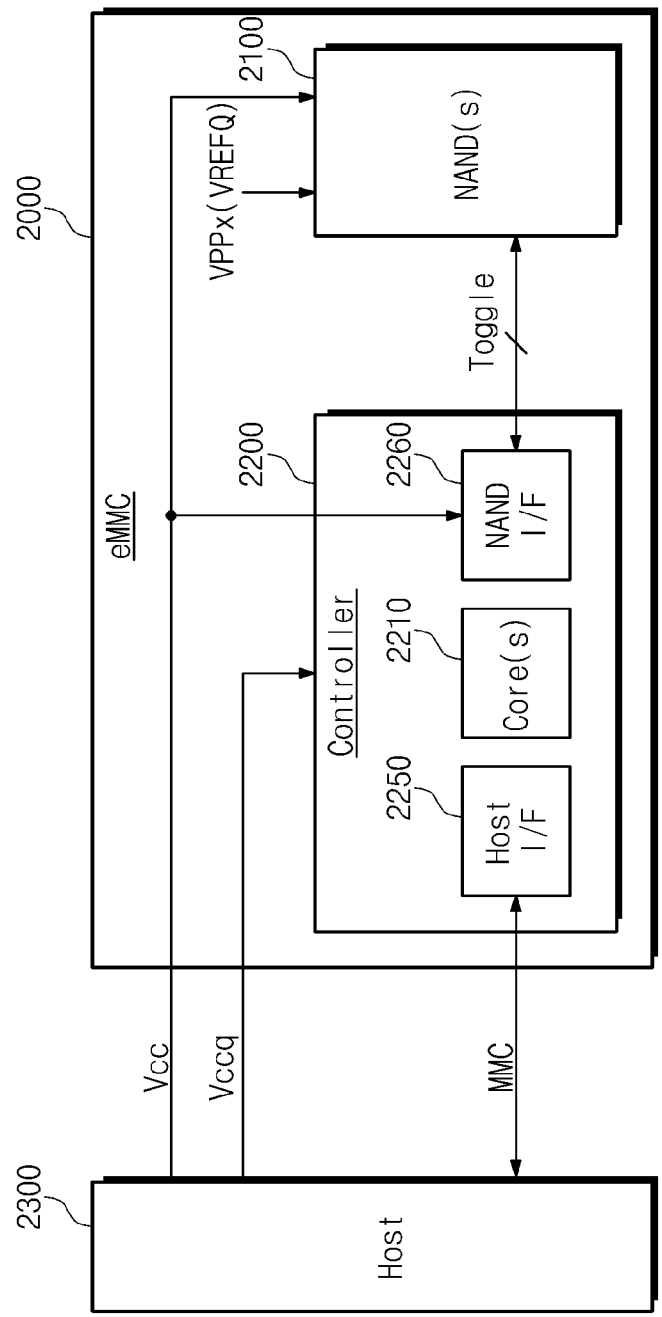
FIG. 10 is a block diagram illustrating an embedded multimedia card (eMMC) according to an embodiment of the inventions.

Aspects of the invention also apply to embodiments of an embedded MMC (hereinafter, referred to as eMMC). FIG. 10 is a block diagram illustrating an eMMC that includes at least one NAND flash memory device 2100 and a controller 2200. The NAND flash memory device 2100 may, for example, be a single data rate (SDR) NAND flash memory device or a double data rate (DDR) NAND flash memory device. The NAND flash memory device 2100 may be implemented by stacking NAND flash memory chips in one package (e.g., FBGA, Fine-pitch Ball Grid Array, etc.). Each of the NAND flash memory devices may be implemented to perform a pre-pulse as described above with reference to FIGS. 1 to 8.

The controller 2200 may be connected with the NAND flash memory device 2100 via a plurality of channels. The controller 2200 may include at least one controller core 2210, a host interface 2250, and a NAND interface 2260. In this illustrative architecture, the controller core 2210 controls overall operation of the eMMC 2000 and the host interface 2250 is configured to provide an interface between the controller 2200 and a host 2300. The NAND interface 2260 is configured to provide an interface between the NAND flash memory device 2100 and the controller 2200. In example embodiments, the host interface 2250 may be a parallel interface (e.g., an MMC interface). In other example embodiments, the host interface 2250 of the eMMC 2000 may be a serial interface (e.g., UHS-II, UFS, etc.).

The eMMC 2000 may receive power supply voltages Vcc and Vccq from the host. Herein, the power supply voltage Vcc (e.g., about 3.3V) may be supplied to the NAND flash memory device 2100 and the NAND interface 2260, and the power supply voltage Vccq (e.g., about 1.8V/3.3V) may be supplied to the controller 2200.

The eMMC 2000 according to an embodiment of the inventive concept is especially useful to small-sized and low-power mobile products (e.g., Galaxy S series, Galaxy note series, iPhone, iPad, Nexus, etc.).

Figure 11:
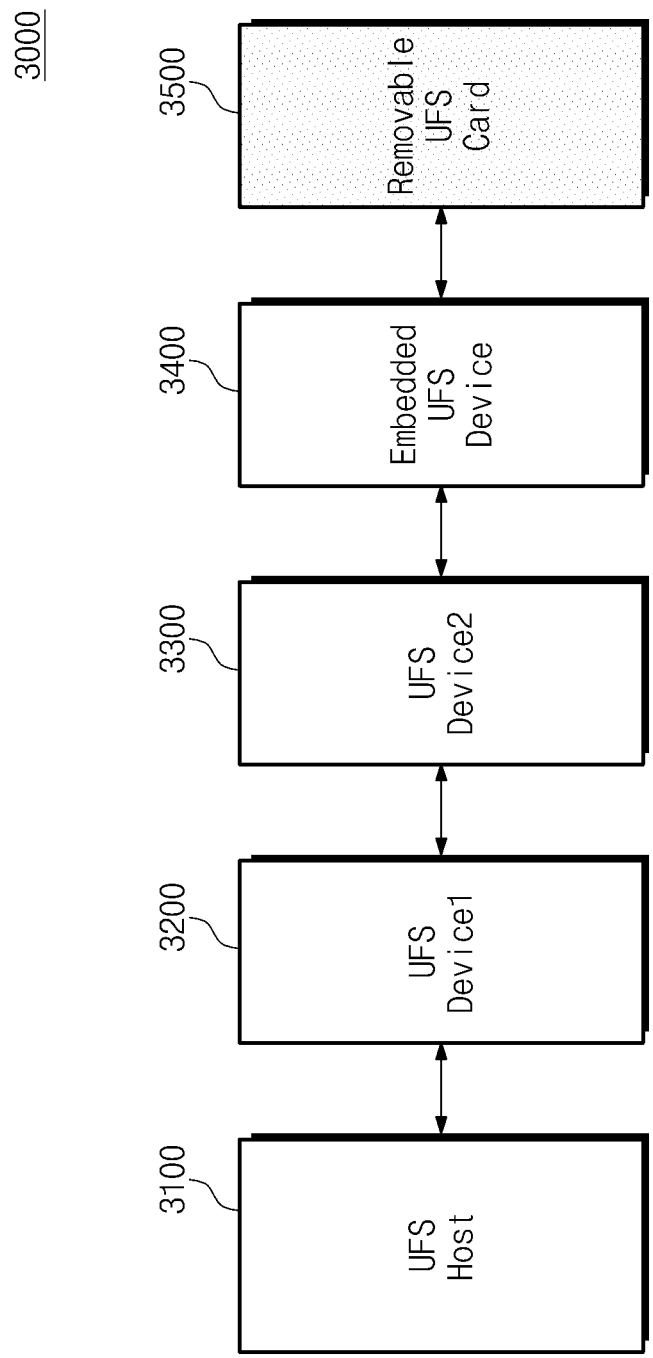
FIG. 11 is a block diagram illustrating a universal flash storage (UFS) system according to an embodiment of the inventions.

Aspects of the inventions also are applicable to universal flash storage (UFS). FIG. 11 is a block diagram schematically illustrating a UFS system 3000 exemplary embodiment that includes a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may include a nonvolatile memory device 100 of FIG. 1, and UFS embodiments can implement and benefit from the systems and methods as described above for FIGS. 1 through 8.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

While the inventive concepts have been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of sequentially accessing memory cells in a nonvolatile memory device having a plurality of strings and a common signal line coupled to the plurality of strings, each string including a plurality of memory cells and a selection transistor coupled between the plurality of memory cells and the common signal line, the method comprising:
    receiving a command to access multiple memory cells in the nonvolatile memory device;
    applying a voltage to a first selection transistor of a first string in the plurality of strings to electrically connect the common signal line to the first string;
    applying a pulse for a predetermined time period to a second selection transistor of a second string and to a third selection transistor of a third string in the plurality of strings; and
    sequentially accessing first and second memory cells of the first string,
    wherein the step of applying the pulse is performed before completion of accessing the first memory cell and there is no pulse applied to the second and third selection transistors between the completion of accessing the first memory cell and completion of accessing the second memory cell.

2. The method of claim 1, wherein:
    the common signal line is a shared bit line,
    the step of receiving the command to access multiple memory cells comprises performing a sequential read operation that accesses multiple memory cells of the first string,
    the step of applying the pulse for a predetermined time period is completed before providing values of memory cells based on the sequential read operation, and
    the step of sequentially accessing first and second memory cells of the first string is completed based on the sequential read operation.

3. The method of claim 1, wherein the common signal line is a shared bit line and the first, second and third selection transistors couple the respective first, second and third strings to the shared bit line.

4. The method of claim 1, wherein the common signal line is a ground line and the first, second and third selection transistors couple the respective first, second and third strings to the ground line.

5. The method of claim 1, further comprising providing the nonvolatile memory device with the plurality of strings configured perpendicular to a substrate of the memory device, each string having a string selection transistor at a first end and a ground selection transistor at a second end opposite the first end.

6. The method of claim 1, wherein applying the pulse includes applying a voltage pulse according to a value corresponding to mode information stored in a register.

7. The method of claim 1, wherein applying the pulse includes receiving mode information from a device external to the nonvolatile memory device.

8. The method of claim 1, wherein receiving the command to access multiple memory cells of the nonvolatile memory device comprises receiving a verification operation command.

9. The method of claim 1, wherein the first, second and third selection transistors are string selection transistors, and further comprising applying a pulse for a predetermined time period to a first ground selection transistor coupled between a common source line and memory cells of the second string and to a second ground selection transistor coupled between the common source line and memory cells of the third string.

10. The method of claim 1, wherein sequentially accessing the first and second memory cells of the first string includes executing first and second read commands, and further comprising providing a ready/busy signal having a high level during a first time period starting before the second read command is received and ending after initiation of the second read command and a low level during a second time period starting after the first time period and ending before completion of a response to the second read command.

11. The method of claim 1, wherein sequentially accessing the first and second memory cells of the first string includes executing first and second read commands, and further comprising maintaining voltages applied to word lines of the second and third strings from a time before the first read command is completed until a time after the second read command is received.

12. The method of claim 1, wherein sequentially accessing the first and second memory cells of the first string includes executing first and second read commands, and further comprising lowering voltages applied to word lines of the second and third strings by a predetermined value from a time before the first read command is completed until a time after the second read command is received.

13. A method of accessing a memory device having a plurality of strings and a common signal line coupled to the plurality of strings, each string including a plurality of memory cells and a selection transistor coupled between the plurality of memory cells and the common signal line, the method comprising:

receiving a command to access multiple memory cells in the memory device;

applying a first voltage to a first selection transistor of a first string in the plurality of strings to electrically connect the common signal line to the first string;

applying a pulse for a predetermined time period to a second selection transistor of a second string and to a third selection transistor of a third string in the plurality of strings; and sequentially accessing first and second memory cells of the first string, wherein sequentially accessing the first and second memory cells of the first string includes executing first and second read commands, and further comprising providing a ready/busy signal having a high level during a first time period starting before the second read command is received and ending after initiation of the second read command and a low level during a second time period starting after the first time period and ending before completion of a response to the second read command.

14. The method of claim 13, wherein the first voltage is applied to the first memory cell of the first string when the second memory cell of the first string is being accessed.

15. The method of claim 13, further comprising:
applying a third voltage less than the first voltage and greater than second voltage for a predetermined time period to the first memory cell of the selected string when the second voltage is applied to the second memory cell of the selected string.

16. A method of accessing a memory device having a plurality of strings and a common signal line coupled to the plurality of strings, each string including a plurality of memory cells and a selection transistor coupled between the plurality of memory cells and the common signal line, the method comprising:

receiving a command to access multiple memory cells in the memory device;

applying a first voltage to a selection transistor of a selected string in the plurality of strings to electrically connect the common signal line to the string;

applying the first voltage for a predetermined time period to a selection transistor of each string of unselected strings in the plurality of strings; and sequentially applying a second voltage to first and second memory cells of the selected string, wherein the first voltage is greater than the second voltage, and the second voltage is greater than a ground voltage.

17. The method of claim 16, wherein sequentially applying the second voltage to the first and second memory cells comprises applying the first voltage to the second memory cell when the second voltage is applied to the first memory cell and applying the first voltage to the first memory cell when the second voltage is applied to the second memory cell.

18. The method of claim 16, wherein the predetermined time period is between a first time at which the first voltage is applied to the selection transistor of the selected string and a second time at which the second voltage is applied to the first memory cell of the selected string.

19. The method of claim 16, wherein receiving the command to access multiple memory cells in the memory device includes receiving a read command and a mode information from a device external to the memory device.

20. The method of claim 16, further comprising:
applying a third voltage less than the first voltage and greater than the second voltage for a predetermined time period to the first memory cell of the selected string when the second voltage is applied to the second memory cell of the selected string.

\* \* \* \* \*